(12) United States Patent
Gao et al.

(10) Patent No.: US 10,340,076 B2
(45) Date of Patent: Jul. 2, 2019

(54) INTEGRATED COPPER BAR FOR SECONDARY POWER CIRCUIT OF POWER ELECTRONIC CONVERTER

(71) Applicant: UNITED AUTOMOTIVE ELECTRONIC SYSTEMS CO. LTD, Shanghai (CN)

(72) Inventors: Zhe Gao, Shanghai (CN); Dengmeng Fu, Shanghai (CN)

(73) Assignee: United Automotive Electronic Systems Co. Ltd., Shanghai (CN)

( * ) Notice: Subject to any disclaimer, the term of this patent is extended or adjusted under 35 U.S.C. 154(b) by 177 days.

(21) Appl. No.: 15/324,490

(22) PCT Filed: Dec. 31, 2014

(86) PCT No.: PCT/CN2014/095873
§ 371 (c)(1),
(2) Date: Jan. 6, 2017

(87) PCT Pub. No.: WO2016/004745
PCT Pub. Date: Jan. 14, 2016

(65) Prior Publication Data
US 2018/0025834 A1    Jan. 25, 2018

(30) Foreign Application Priority Data

Jul. 11, 2014    (CN) .......................... 2014 1 0328942

(51) Int. Cl.
*H01F 27/28*    (2006.01)
*H01F 30/10*    (2006.01)
(Continued)

(52) U.S. Cl.
CPC .............. *H01F 30/10* (2013.01); *H01F 5/04* (2013.01); *H01F 5/06* (2013.01); *H01F 27/2847* (2013.01);
(Continued)

(58) Field of Classification Search
CPC .... H01F 5/04; H01F 27/2847; H01F 27/2871; H01F 5/06
(Continued)

(56) References Cited

U.S. PATENT DOCUMENTS 5,986,912 A * 11/1999 Hsiao ...................... H02M 3/00
                                                363/147
6,211,767 B1   4/2001 Jitaru
(Continued)

FOREIGN PATENT DOCUMENTS

CN    101529536 A    9/2009
CN    101630917 A    1/2010
(Continued)

OTHER PUBLICATIONS

Search Report for Chinese Patent Application No. 2014103289422.
(Continued)

*Primary Examiner* — Tszfung J Chan
(74) *Attorney, Agent, or Firm* — MKG, LLC

(57) ABSTRACT

An integrated copper bar for a secondary power circuit of a power electronic converter, including a transformer primary winding copper bar, a transformer secondary winding copper bar, an inductor winding copper bar, a copper bar for connecting a detection resistor, a copper bar for connecting a drive circuit and a copper bar for connecting an output terminal; wherein, said transformer primary winding copper bar, said transformer secondary winding copper bar, said inductor winding copper bar, said copper bar for connecting a detection resistor, said copper bar for connecting a drive circuit and said copper bar for connecting an output ground terminal are fixed together via injection molding.

5 Claims, 18 Drawing Sheets

(51) Int. Cl.
*H02M 1/00* (2006.01)
*H01F 5/04* (2006.01)
*H01F 5/06* (2006.01)
*H02M 3/335* (2006.01)
*H01F 27/30* (2006.01)
*H01F 27/40* (2006.01)
*H05K 1/16* (2006.01)
*H05K 3/20* (2006.01)

(52) U.S. Cl.
CPC ....... *H01F 27/2871* (2013.01); *H01F 27/303* (2013.01); *H01F 27/40* (2013.01); *H02M 1/00* (2013.01); *H02M 3/33592* (2013.01); *H01F 2027/2861* (2013.01); *H02M 2001/0083* (2013.01); *H05K 1/165* (2013.01); *H05K 3/202* (2013.01); *H05K 2201/09118* (2013.01); *Y02B 70/1475* (2013.01)

(58) Field of Classification Search
USPC .................................................. 336/200, 232
See application file for complete search history.

(56) References Cited

U.S. PATENT DOCUMENTS

| | | |
|---|---|---|
| 7,266,003 B2 | 9/2007 | Lanni |
| 2005/0266730 A1 | 12/2005 | Lanni |
| 2006/0215381 A1 | 9/2006 | Lanni |
| 2006/0227580 A1 | 10/2006 | Lanni |
| 2006/0250829 A1 | 11/2006 | Lanni |
| 2006/0250830 A1 | 11/2006 | Lanni |
| 2006/0256595 A1 | 11/2006 | Lanni |
| 2007/0279952 A1 | 12/2007 | Lanni |
| 2008/0012425 A1 | 1/2008 | Lanni |
| 2008/0151581 A1 | 6/2008 | Lanni |
| 2009/0289750 A1 | 11/2009 | Ohsawa |
| 2010/0109436 A1 | 5/2010 | Lanni |

FOREIGN PATENT DOCUMENTS

| | | |
|---|---|---|
| CN | 102549903 A | 7/2012 |
| CN | 204190595 U | 3/2015 |
| DE | 112007002320 T5 | 7/2009 |
| JP | 2006288052 A | 10/2006 |
| JP | 5090364 B2 | 9/2012 |
| JP | 2014121117 A | 6/2014 |
| WO | 2008053613 A1 | 5/2008 |

OTHER PUBLICATIONS

International Search Report for PCT Application No. PCT/CN2014/095873, dated Apr. 3, 2015.
Supplementary European Search Report for European Application No. EP 14897174, dated Feb. 1, 2018.
Notification of Reasons of Refusal issued in Japanese Application No. 2017-521271, dated Nov. 12, 2018.

* cited by examiner

INTEGRATED COPPER BAR FOR SECONDARY POWER CIRCUIT OF POWER ELECTRONIC CONVERTER

FIELD OF THE INVENTION

The present invention relates to a power electronic converter for new energy vehicles, particularly to an integrated copper bar for a secondary power circuit of a power electronic converter.

BACKGROUND OF THE INVENTION

Power electronic converters used in new energy vehicles (electric vehicles and hybrid electric vehicles) are used for converting the high-voltage direct current delivered by a high-voltage battery of the new energy vehicle into low-voltage direct current. The primary side of the power electronic converter converts high-voltage direct current into high-voltage alternating current, which is then transformed into low-voltage alternating current after passing through a transformer, and the low-voltage alternating current is converted into low-voltage direct current by the secondary side of the converter.

The power electronic converter is shown in FIG. 1, and its secondary power circuit is shown in FIG. 2, where the inclusion of a transformer, an inductor, power devices, resistors, etc. represents a considerable challenge to the design of the copper bar structure. Issues to be solved include:
(1) The assembly complexity due to the use of a large number of components in and the complexity of the converter secondary power circuit;
(2) The bulky size and high costs resulting from the effort to reduce the temperature rise of the copper bar, which produces lots of heat because of the high current the converter secondary power circuit carries;
(3) The difficulty in making good connections between the converter secondary-side power devices (such as Metal-Oxide Semiconductor Field Effect Transistors (MOSFET)) and the power circuit;
(4) The complexity of connecting the converter secondary power circuit with the magnetic components, and the high costs of the magnetic components;
(5) The difficulty in making a good connection between the magnetic component primary winding and the converter primary circuit.

SUMMARY OF THE INVENTION

One of the purposes of the present invention is to provide an integrated copper bar for a secondary power circuit of a power electronic converter which is characterized by easy assembly, small size, low cost and convenience of connecting with power devices, magnetic components and the primary circuit.

To achieve the above purpose, the present invention discloses an integrated copper bar for a secondary power circuit of a power electronic converter, including a transformer primary winding copper bar, a transformer secondary winding copper bar, an inductor winding copper bar, a copper bar for connecting a detection resistor, a copper bar for connecting a drive circuit and a copper bar for connecting an output terminal;

The transformer primary winding copper bar, the transformer secondary winding copper bar, the inductor winding copper bar, the copper bar for connecting a detection resistor, the copper bar for connecting a drive circuit and the copper bar for connecting an output ground terminal are fixed together via injection molding.

Preferably, the transformer primary winding copper bar includes a primary winding, an upper pin of the primary winding and a lower pin of the primary winding;

The primary winding is formed by more than 5 turns of wire lying in a same plane;

The upper pin of the primary winding and the lower pin of the primary winding are formed at two ends of the primary winding respectively, and are perpendicular to the plane of the primary winding;

The transformer secondary winding copper bar includes a secondary winding, a first drain pin, a second drain pin, an upper pin of the secondary winding and a lower pin of the secondary winding;

The secondary winding includes a copper bar of the upper coil of the secondary winding and a copper bar of the lower coil of the secondary winding, each shaped as an open loop; the copper bar of the upper coil of the secondary winding and the copper bar of the lower coil of the secondary winding are disposed in two different planes, and connected at one end to form a central tap, with the other ends extending forward respectively;

The first drain pin and the upper pin of the secondary winding are formed on the forward extension of the copper bar of the upper coil of the secondary winding, with the first drain pin disposed in front of the upper pin of the secondary winding;

The second drain pin and the lower pin of the secondary winding are formed on the forward extension of the copper bar of the lower coil of the secondary winding, with the second drain pin disposed in front of the lower pin of the secondary winding;

The first drain pin and the second drain pin are parallel to the plane on which the copper bar of the upper coil of the secondary winding and the copper bar of the lower coil of the secondary winding are formed;

The upper pin of the secondary winding and the lower pin of the secondary winding are perpendicular to the plane on which the copper bar of the upper coil of the secondary winding and the copper bar of the lower coil of the secondary winding are formed;

The inductor winding copper bar includes an inductor winding, a low-voltage output connector and a low-voltage output pin;

The inductor winding includes a copper bar of the upper coil of the inductor winding and a copper bar of the lower coil of the inductor winding, each shaped as an open loop, the copper bar of the upper coil of the inductor winding and the copper bar of the lower coil of the inductor winding are disposed in two different planes, and connected at one end, the other end of the copper bar of the lower coil extends forward and that of the copper bar of the upper coil extends to the right respectively;

A secondary winding connector is formed on the right extension of the copper bar of the upper coil of the inductor;

The low-voltage output connector and the low-voltage output pin are formed on the forward extension of the copper bar of the lower coil of the inductor;

The low-voltage output pin is perpendicular to the plane on which the copper bar of the upper coil of the inductor and the copper bar of the lower coil of the inductor are formed;

The copper bar for connecting a detection resistor is an elongated structure, with a ground pin and two source pins formed at the center, a pre-detection resistor connector formed on the left, and the ground pin being perpendicular to the source pins;

The copper bar for connecting a drive circuit includes a first gate pin and a second gate pin, with the first gate pin bending downwards at both ends, the second gate pin disposed on the mid-left of the first gate pin and the second gate pin being perpendicular to the first gate pin;

The copper bar for connecting the output ground terminal has a ground pin formed at the center, a connector for the output ground terminal formed on the forward left, and a connector for the post-detection resistor formed on the rear right;

The copper bar of the transformer secondary winding is disposed above the transformer primary winding copper bar, with the center of the primary winding corresponds to that of the secondary winding;

The inductor winding copper bar is disposed at the left side of the transformer secondary winding copper bar and the transformer primary winding copper bar, with the secondary winding connector of the inductor winding copper bar electrically connected with the central tap of the transformer secondary winding copper bar;

The copper bar for connecting a detection resistor is disposed in front of the transformer secondary winding copper bar, with two source pins arranged sequentially and alternately with two drain pins of the transformer secondary winding copper bar and two gate pins of the copper bar for connecting a drive circuit, thereby forming two groups of pins for connecting power devices;

The copper bar for connecting an output ground terminal is disposed in front of the inductor winding copper bar and on the left side of the copper bar for connecting a detection resistor;

The upper pin of primary winding, lower pin of primary winding, upper pin of secondary winding, lower pin of secondary winding, low-voltage output pin, ground pin, and gate pins all protrude from the upper surface of the plastic structure;

Drain pins, source pins, gate pins, pre-detection resistor connector, post-detection resistor connector, low-voltage output connector and output ground terminal connector are all disposed outside of the plastic structure.

Preferably, the bottom surface of the integrated copper bar for a secondary power circuit of a power electronic converter is disposed outside of the plastic structure.

Preferably, the primary winding is shaped as a rectangle;

The copper bar of the upper coil of the secondary winding and the copper bar of the lower coil of the secondary winding are each shaped as an unclosed rectangle;

The copper bar of the upper coil of the inductor and the copper bar of the lower coil of the inductor are each shaped as an unclosed rectangle.

Preferably, two detection resistor connectors, the low-voltage output connector and the output ground terminal connector all have a round hole formed therein;

The detection resistor connects two detection resistor connectors;

The low-voltage output connector and the output ground terminal connector connect with corresponding copper bars through self-clinging nuts.

The integrated copper bar for the secondary power circuit of a power electronic converter in accordance with the present invention holds all copper bar structures together through injection molding, and also integrates the winding copper bar structures of the transformer with those of the inductor. The integrated copper bar thus formed connects with the detection resistor and the output terminal by self-clinging nuts; the power circuit is connected with the control circuit and the high-voltage circuit through optional soldering vertical pins onto the PCB; pins of power devices (such as MOSFETs) are laser soldered to the integrated copper bar to create an electric connection; bushing is provided through injection molding at proper positions to ensure that the nuts of the integrated copper bar are properly secured; the bottom surface of the power circuit copper bar is exposed, where the copper bar and the cooling plate are connected by an insulating and thermally conductive pad, and the cooling plate significantly reduces the temperature rise of the integrated copper bar by dissipating the heat directly, thereby the cross-sectional size and the volume of the integrated copper bar is reduced.

The integrated copper bar for the secondary power circuit of a power electronic converter in accordance with the present invention makes manufacturing and assembly easier; the integration of the winding copper bar structures of the transformer with those of the inductor simplifies the connection structures among the transformer, the inductor and the integrated copper bar; the transformer primary winding formed by punching pressing the copper bar, and the connection between the copper bar and the PCB through optionally soldering pins simplifies the connection between the transformer primary winding and the PCB; power devices (MOSFET) are connected with the integrated copper bar via laser soldering; the integrated structure of all copper bars, together with the magnetic core structure, constitutes the transformer and the inductor, and other magnetic components to perform corresponding functions. A proper magnetic core structure may be designed and assembled to function as a magnetic component with the winding structure, which eliminates the need to purchase power magnetic components and thus significantly reduces the costs.

BRIEF DESCRIPTION OF ACCOMPANYING DRAWINGS

To clearly illustrate the implementation of the technology in accordance with the present invention, a brief description of the accompanying drawings is given in the following part. Significantly, the accompanying drawings do not represent all the embodiments of the present invention. An ordinary technician in the present art may obtain other drawings from these accompanying drawings without making any creative efforts.

DETAILED DESCRIPTION OF EMBODIMENTS

Figure 1:
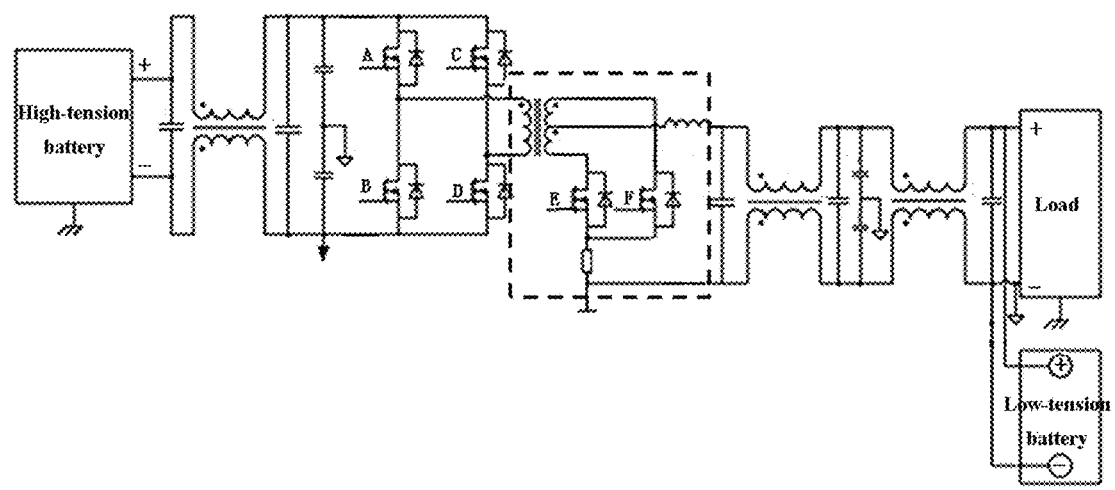
FIG. 1 illustrates a power electronic converter circuit.
Figure 2:
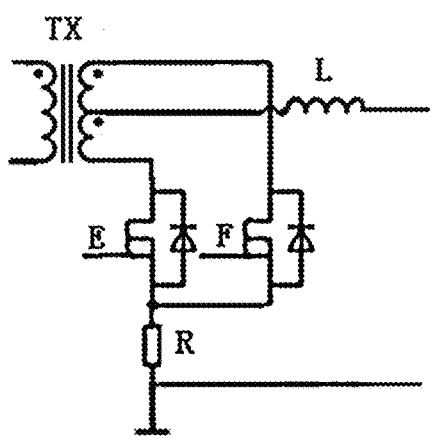
FIG. 2 illustrates a secondary power circuit of the power electronic converter.

A clear and complete description of the present invention will be given in the following part by reference to the drawings. Significantly, the following description does not present the embodiments of the present invention exhaustively. Without departing from the spirit of the present invention, a person having ordinary skills in the art may make various modifications and improvements, which shall be considered to fall within the scope of the present invention.

The integrated copper bar for a secondary power circuit of a power electronic converter includes a transformer primary winding copper bar 1, a transformer secondary winding copper bar 2, an inductor winding copper bar 3, a copper bar 4 for connecting a detection resistor, a copper bar 5 for connecting a drive circuit and a copper bar 6 for connecting an output terminal.

Figure 27:
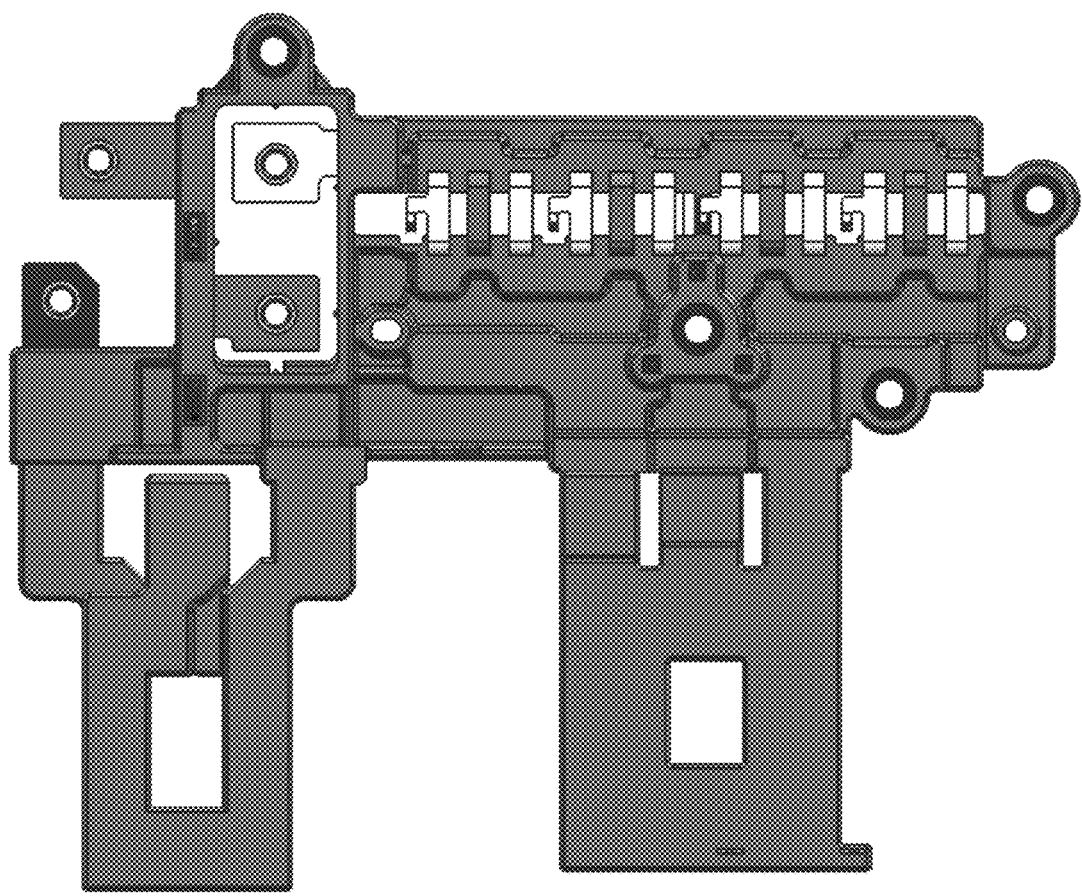
FIG. 27 is a top view of the integrated copper bar for a secondary power circuit of a power electronic converter disclosed in the present invention.
Figure 28:
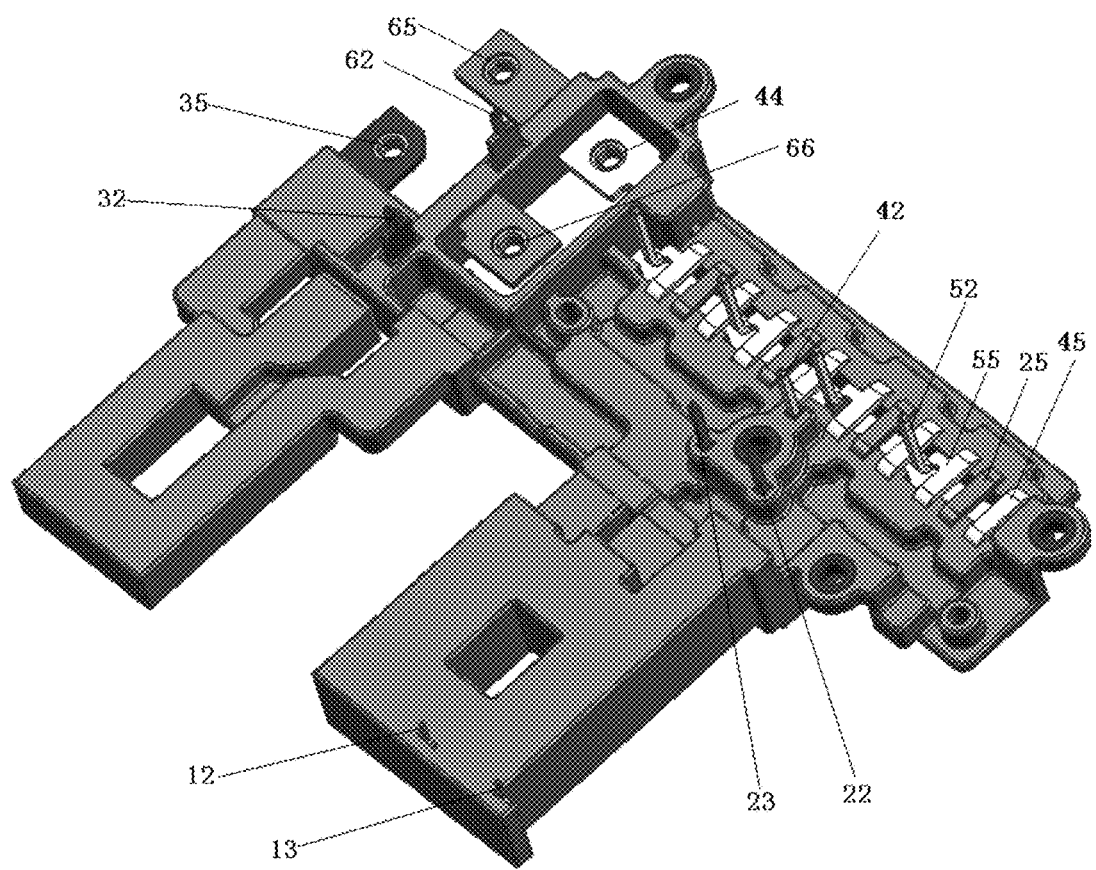
FIG. 28 is a perspective view of the integrated copper bar for a secondary power circuit of a power electronic converter disclosed in the present invention.
Figure 29:
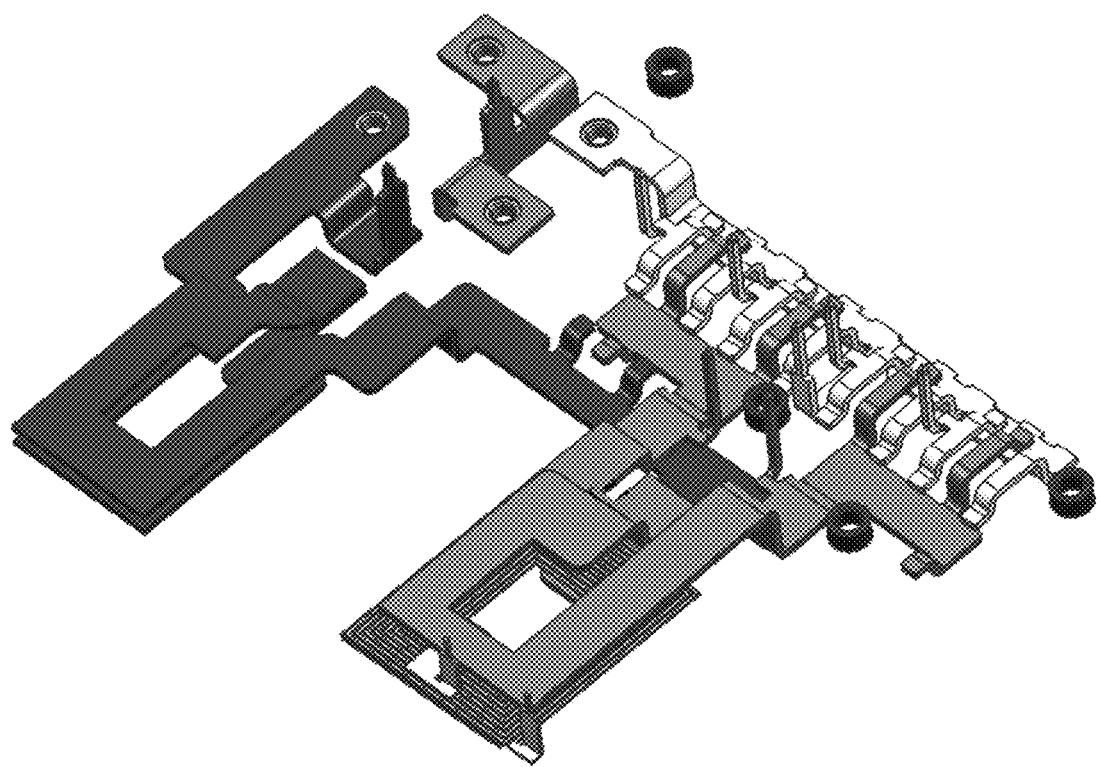
FIG. 29 is a perspective view of the copper bar within the plastic structure of the integrated copper bar for a secondary power circuit of a power electronic converter disclosed in the present invention.
Figure 30:
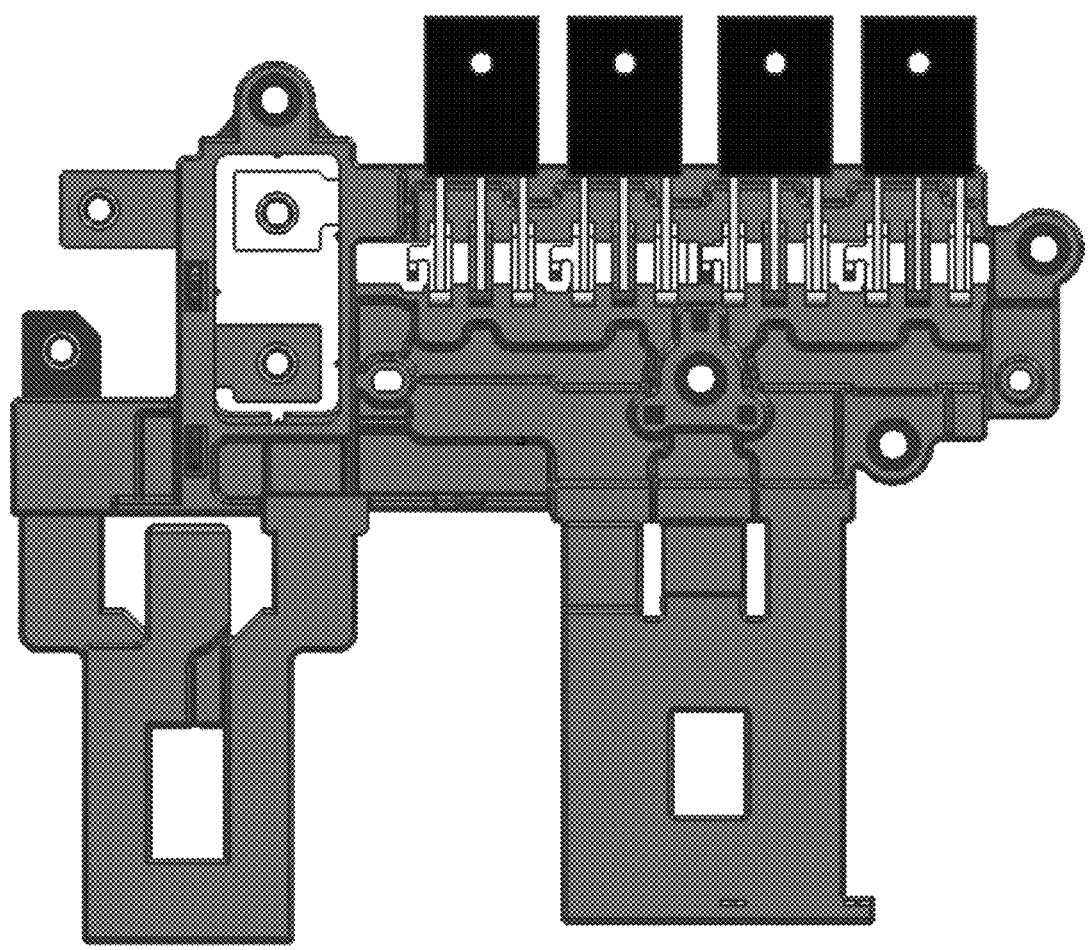
FIG. 30 is a top view of the integrated copper bar for a secondary power circuit of a power electronic converter disclosed in the present invention whereto a MOSFET has been laser soldered.
Figure 31:
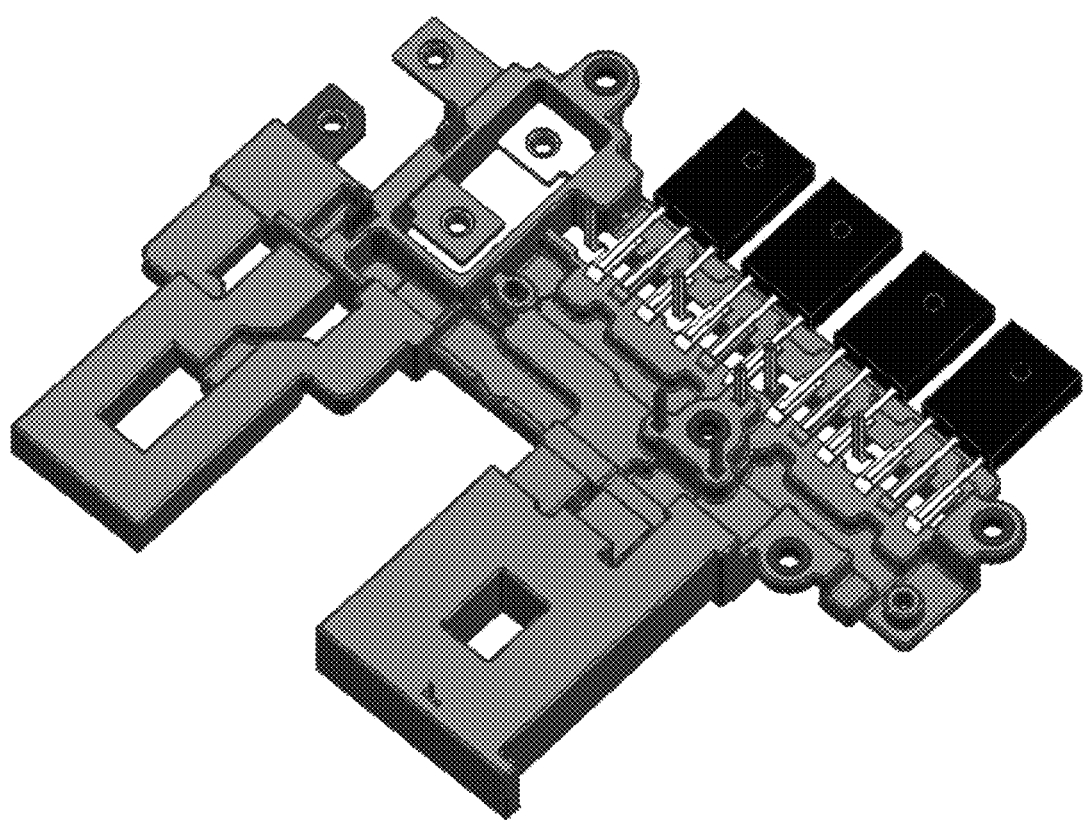
FIG. 31 is a front perspective view of the integrated copper bar for a secondary power circuit of a power electronic converter disclosed in the present invention to which MOSFET has been laser soldered.
Figure 32:
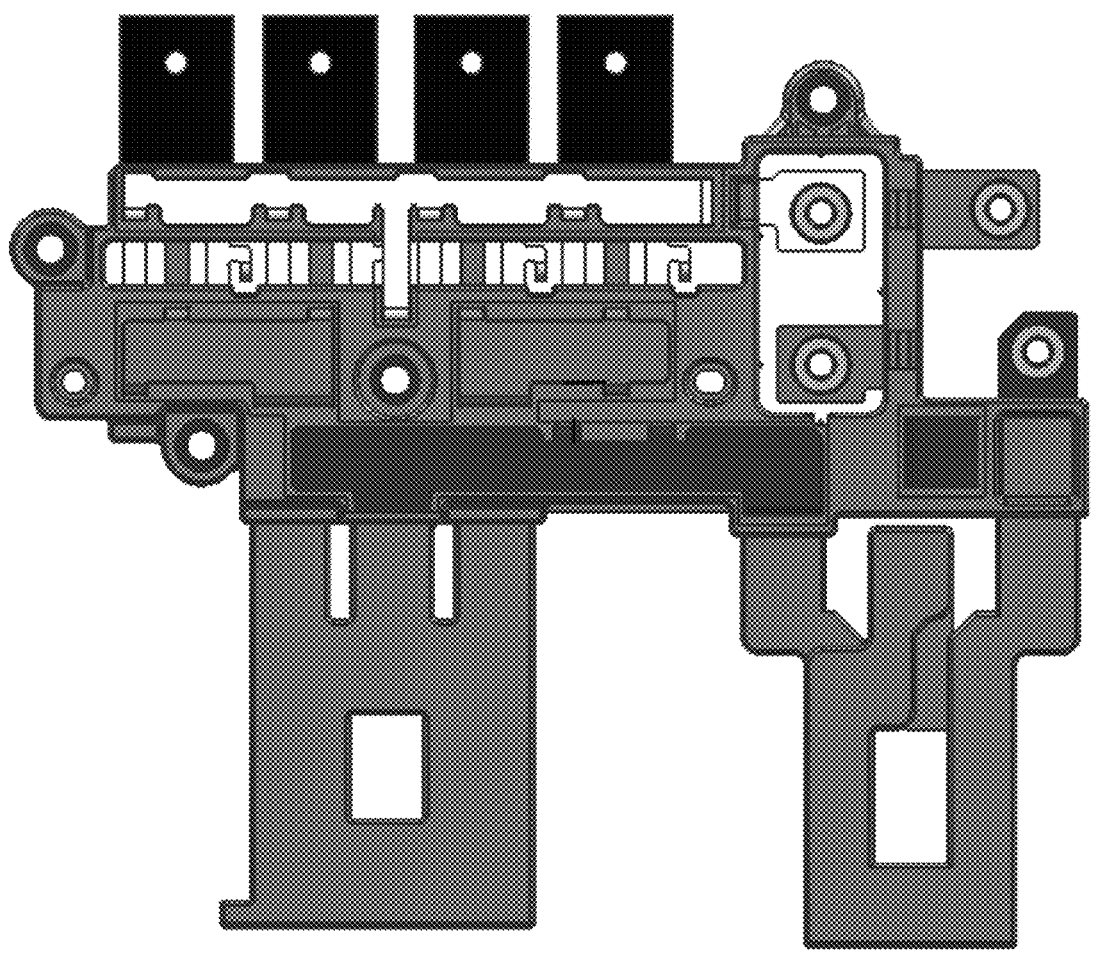
FIG. 32 is a bottom view of the integrated copper bar for a secondary power circuit of a power electronic converter disclosed in the present invention whereto a MOSFET has been laser soldered.
Figure 33:
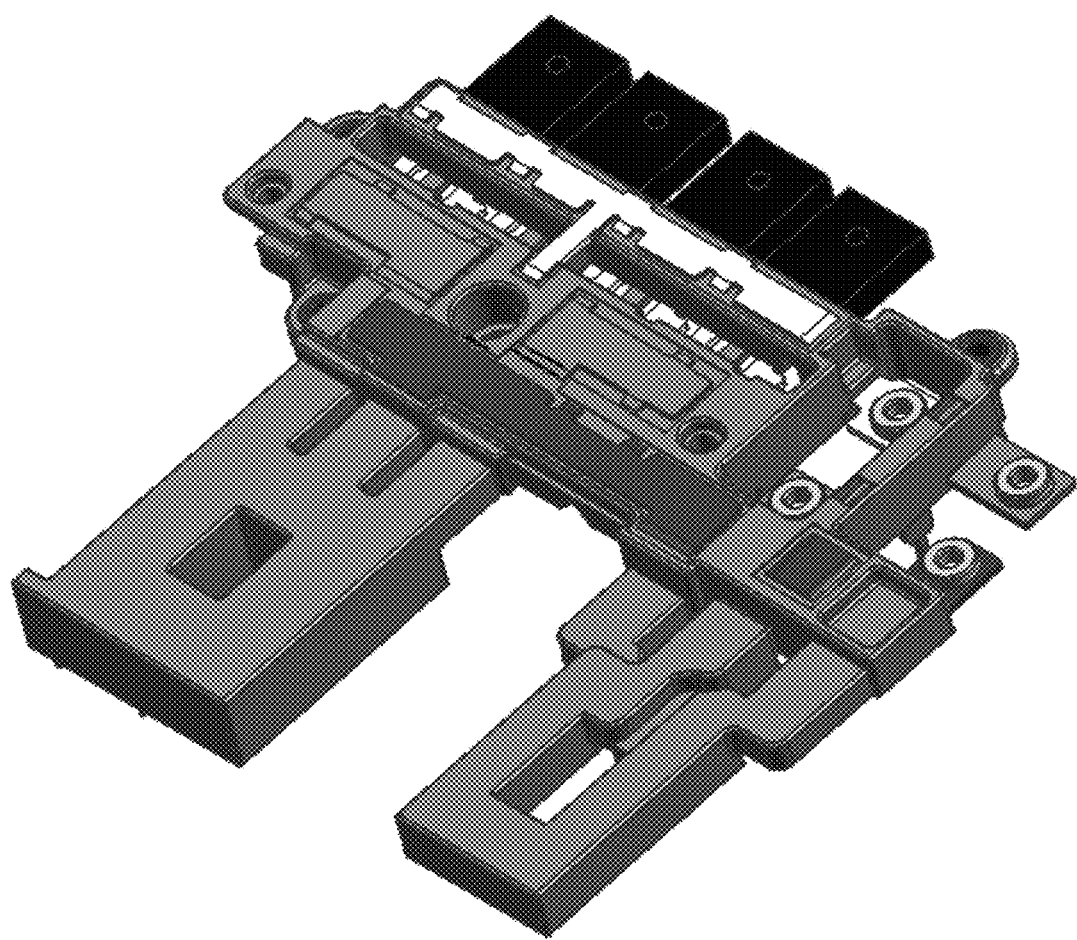
FIG. 33 is a back perspective view of the integrated copper bar for a secondary power circuit of a power electronic converter disclosed in the present invention whereto a MOSFET has been laser soldered.

Transformer primary winding copper bar 1, transformer secondary winding copper bar 2, inductor winding copper bar 3, copper bar 4 for connecting a detection resistor, copper bar 5 for connecting a drive circuit and copper bar 6 for connecting an output ground terminal are fixed together via injection molding, as shown in FIGS. 27-33.

Figure 3:
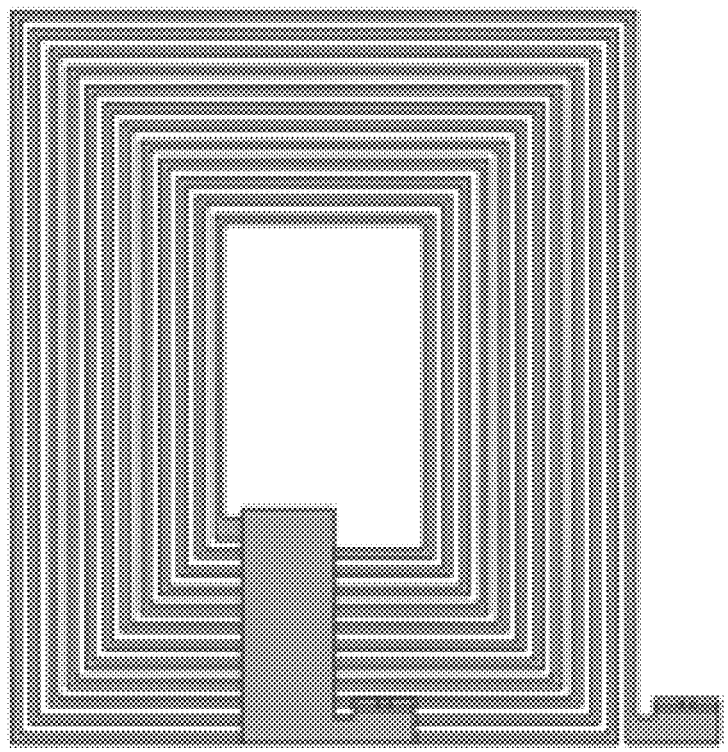
FIG. 3 is a top view of the transformer primary winding copper bar of the integrated copper bar for a secondary power circuit of a power electronic converter disclosed in the present invention.
Figure 4:
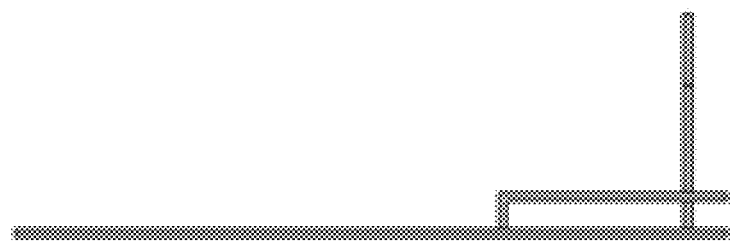
FIG. 4 is a left view of the transformer primary winding copper bar of the integrated copper bar for a secondary power circuit of a power electronic converter disclosed in the present invention.
Figure 5:
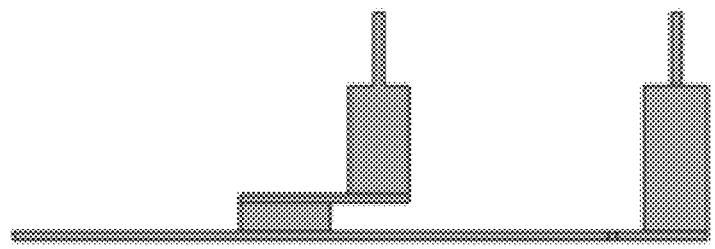
FIG. 5 is a front view of the transformer primary winding copper bar of the integrated copper bar for a secondary power circuit of a power electronic converter disclosed in the present invention.
Figure 6:
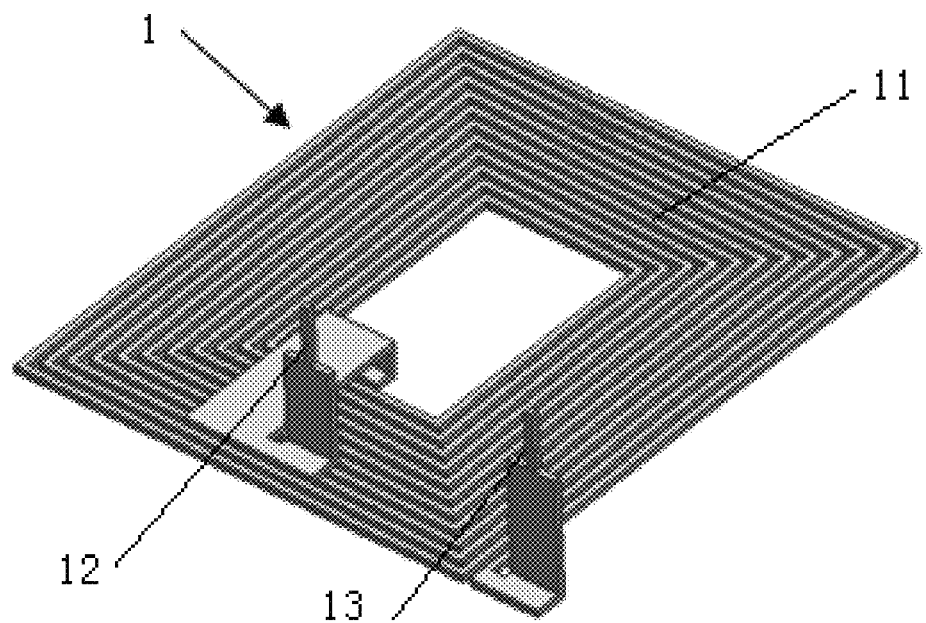
FIG. 6 is a perspective view of the transformer primary winding copper bar of the integrated copper bar for a secondary power circuit of a power electronic converter disclosed in the present invention.
Figure 7:
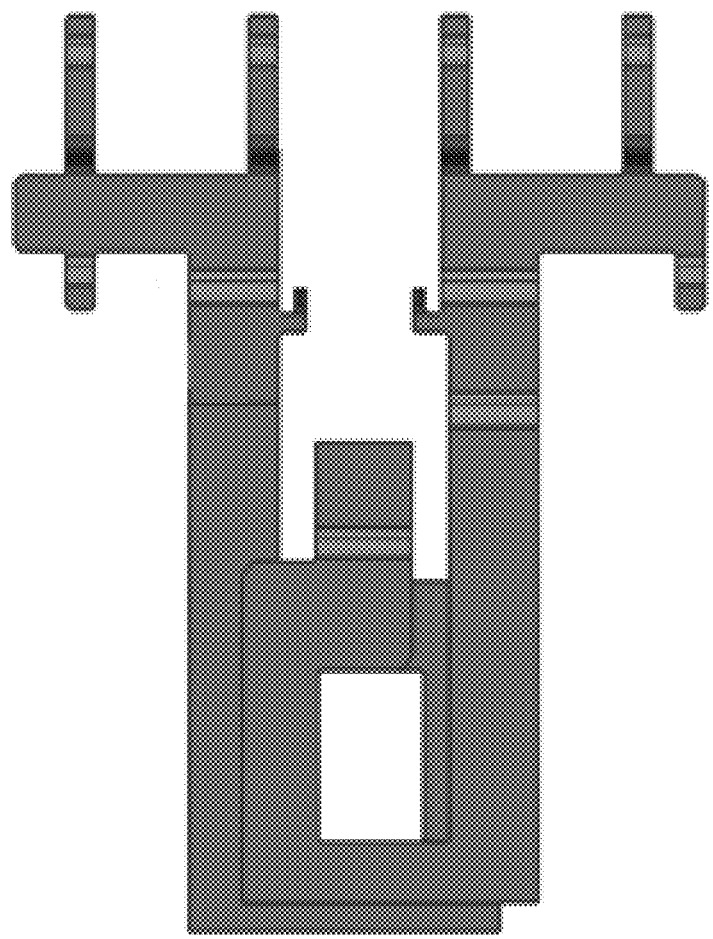
FIG. 7 is a top view of the transformer secondary winding copper bar of the integrated copper bar for a secondary power circuit of a power electronic converter disclosed in the present invention.
Figure 8:
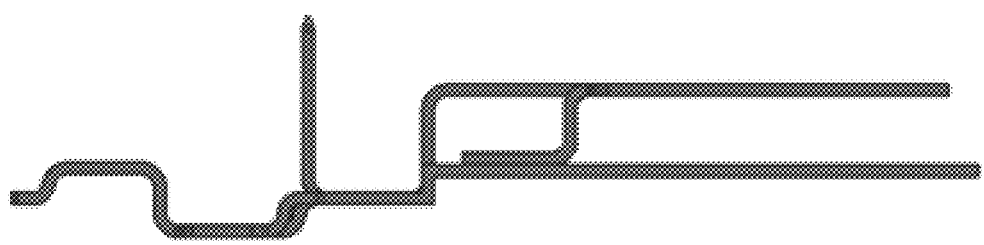
FIG. 8 is a left view of the transformer secondary winding copper bar of the integrated copper bar for a secondary power circuit of a power electronic converter disclosed in the present invention.
Figure 9:
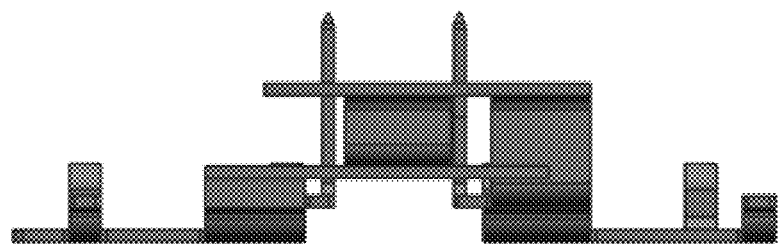
FIG. 9 is a front view of the transformer secondary winding copper bar of the integrated copper bar for a secondary power circuit of a power electronic converter disclosed in the present invention.
Figure 10:
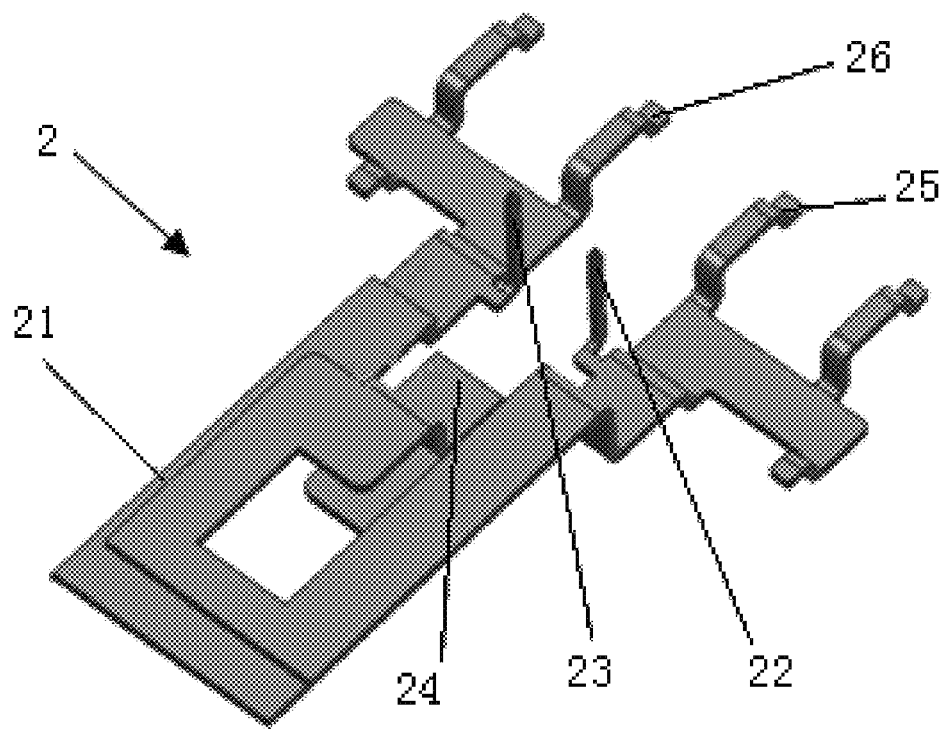
FIG. 10 is a perspective view of the transformer secondary winding copper bar of the integrated copper bar for a secondary power circuit of a power electronic converter disclosed in the present invention.
Figure 11:
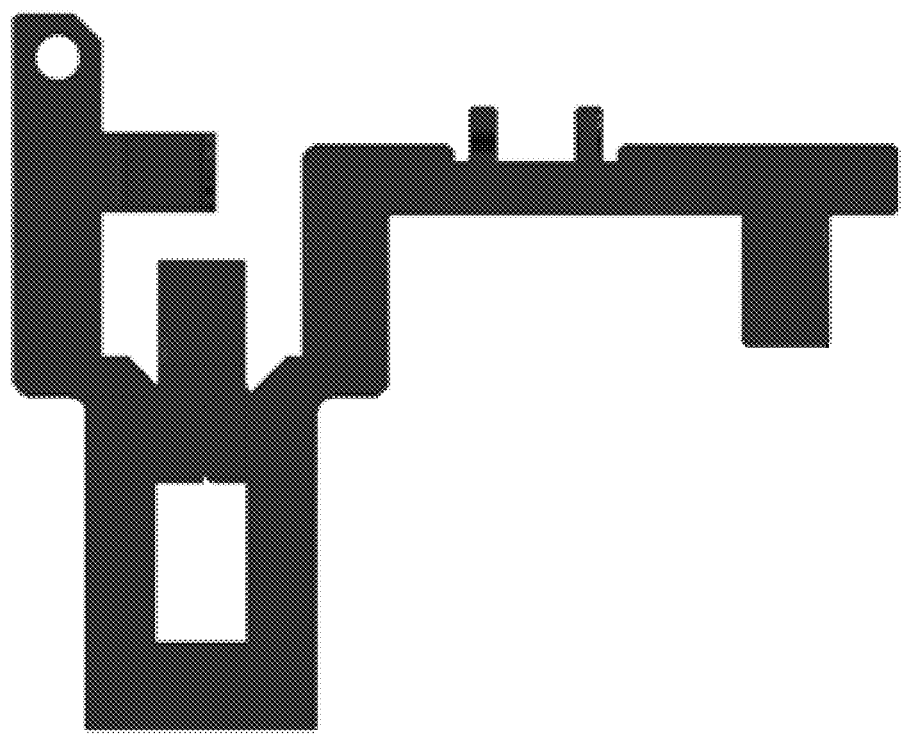
FIG. 11 is a top view of the inductor winding copper bar of the integrated copper bar for a secondary power circuit of a power electronic converter disclosed in the present invention.
Figure 12:
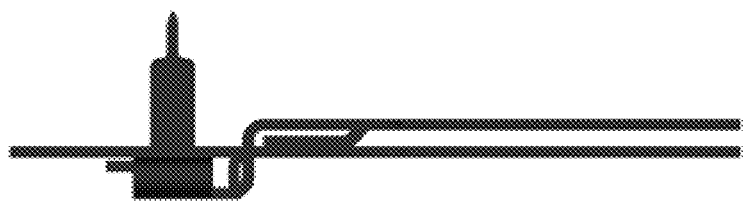
FIG. 12 is a left view of the inductor winding copper bar of the integrated copper bar for a secondary power circuit of a power electronic converter disclosed in the present invention.
Figure 13:
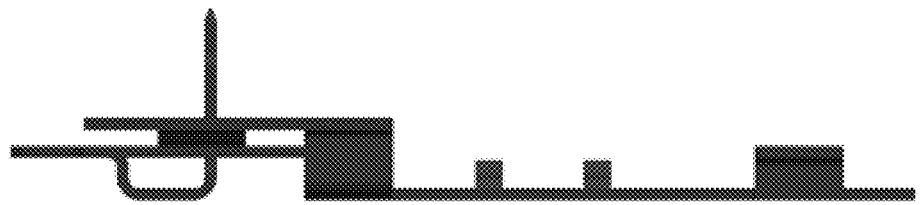
FIG. 13 is a front view of the inductor winding copper bar of the integrated copper bar for a secondary power circuit of a power electronic converter disclosed in the present invention.
Figure 14:
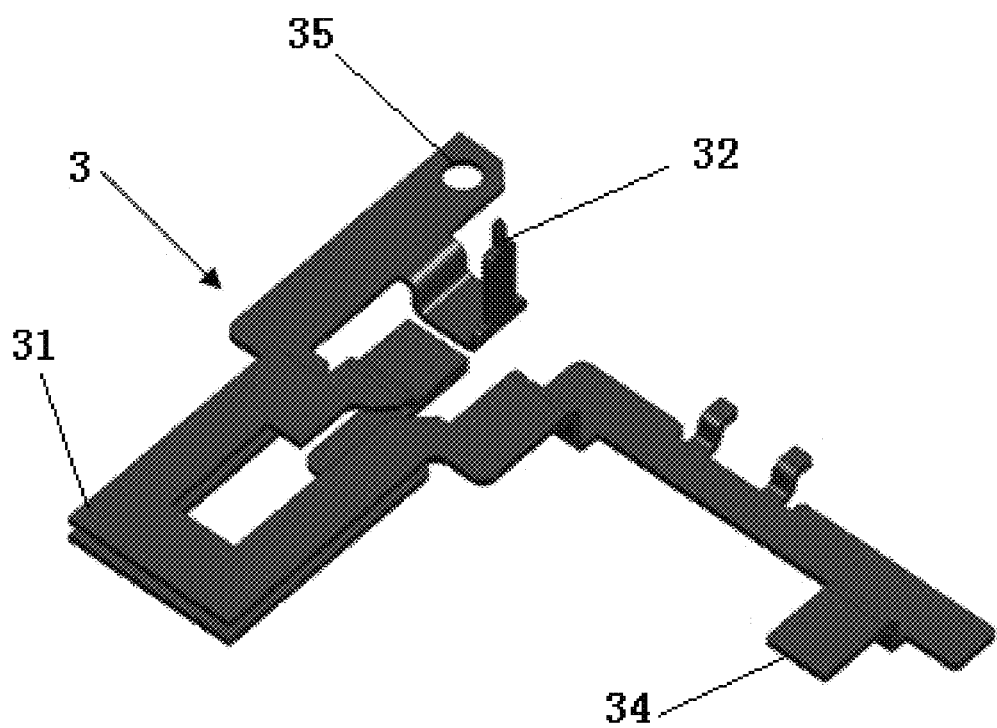
FIG. 14 is a perspective view of the inductor winding copper bar of the integrated copper bar for a secondary power circuit of a power electronic converter disclosed in the present invention.
Figure 15:
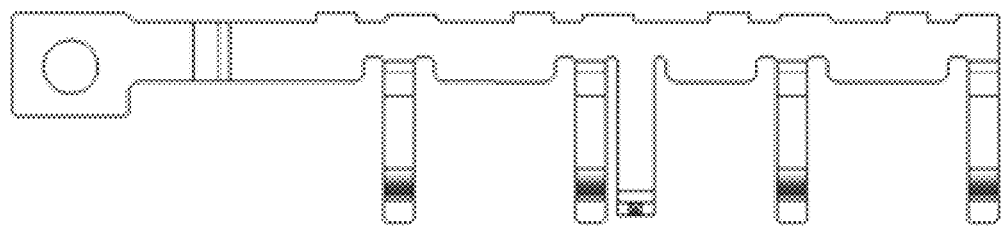
FIG. 15 is a top view of the copper bar for connecting a detection resistor of the integrated copper bar for a secondary power circuit of a power electronic converter disclosed in the present invention.
Figure 16:
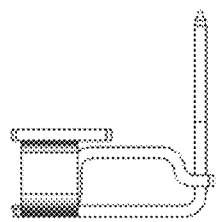
FIG. 16 is a left view of the copper bar for connecting a detection resistor of the integrated copper bar for a secondary power circuit of a power electronic converter disclosed in the present invention.
Figure 17:
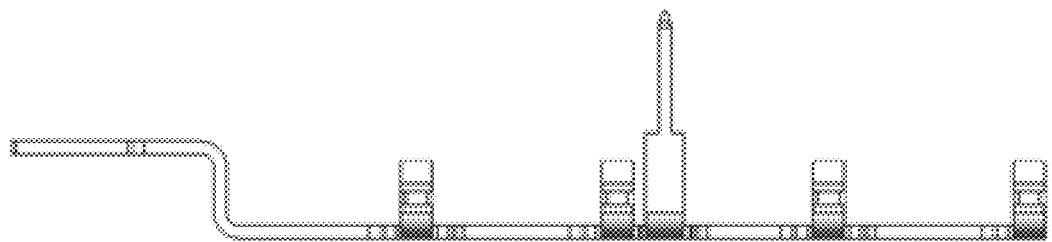
FIG. 17 is a front view of the copper bar for connecting a detection resistor of the integrated copper bar for a secondary power circuit of a power electronic converter disclosed in the present invention.
Figure 18:
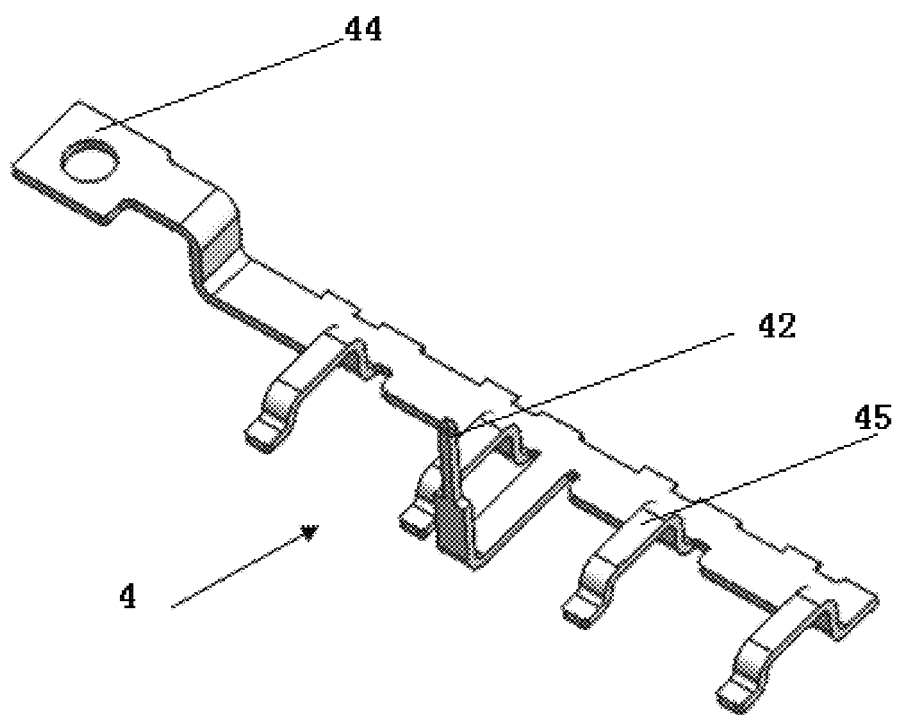
FIG. 18 is a perspective view of the copper bar for connecting a detection resistor of the integrated copper bar for a secondary power circuit of a power electronic converter disclosed in the present invention.
Figure 19:
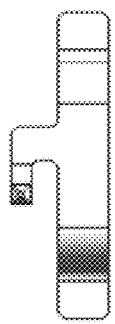
FIG. 19 is a top view of the copper bar for connecting a drive circuit of the integrated copper bar for a secondary power circuit of a power electronic converter disclosed in the present invention.
Figure 20:
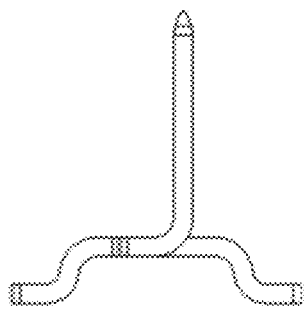
FIG. 20 is a left view of the copper bar for connecting a drive circuit of the integrated copper bar for a secondary power circuit of a power electronic converter disclosed in the present invention.
Figure 21:
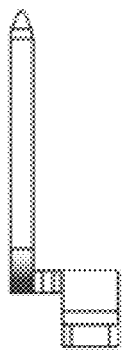
FIG. 21 is a front view of the copper bar for connecting a drive circuit of the integrated copper bar for a secondary power circuit of a power electronic converter disclosed in the present invention.
Figure 22:
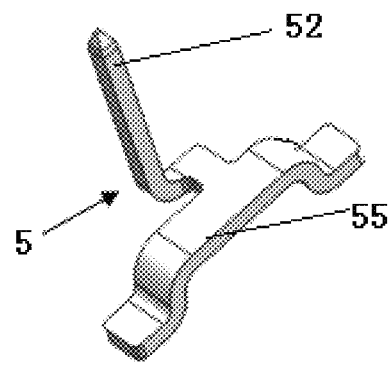
FIG. 22 is a perspective view of the copper bar for connecting a drive circuit of the integrated copper bar for a secondary power circuit of a power electronic converter disclosed in the present invention.
Figure 23:
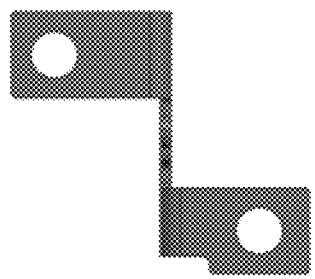
FIG. 23 is a top view of the copper bar for connecting an output ground terminal of the integrated copper bar for a secondary power circuit of a power electronic converter disclosed in the present invention.
Figure 24:
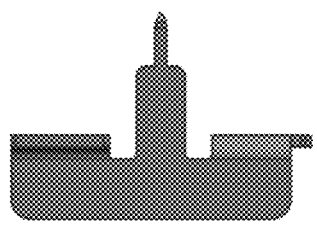
FIG. 24 is a left view of the copper bar for connecting an output ground terminal of the integrated copper bar for a secondary power circuit of a power electronic converter disclosed in the present invention.
Figure 25:
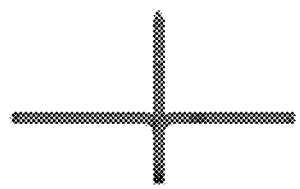
FIG. 25 is a front view of the copper bar for connecting an output ground terminal of the integrated copper bar for a secondary power circuit of a power electronic converter disclosed in the present invention.
Figure 26:
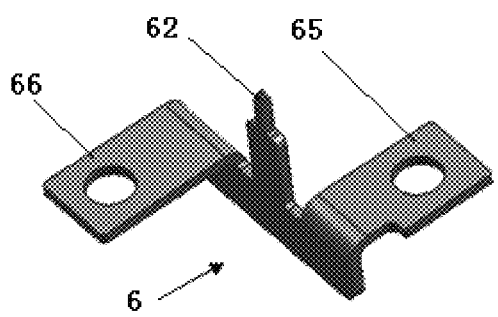
FIG. 26 is a perspective view of the copper bar for connecting an output ground terminal of the integrated copper bar for a secondary power circuit of a power electronic converter disclosed in the present invention.

Transformer primary winding copper bar 1, as shown in FIGS. 3-6, includes a primary winding 11, an upper pin 12 of the primary winding and an lower pin 13 of the primary winding; Primary winding 11 is formed by more than 5 turns of wire lying in the same plane;

Upper pin 12 of the primary winding and lower pin 13 of the primary winding are formed at two ends of primary winding 11 and are perpendicular to the plane of the primary winding;

Transformer secondary winding copper bar 2, as shown in FIGS. 7 to 10, includes a secondary winding 21, a first drain pin 25, a second drain pin 26, an upper pin 22 of the secondary winding and a lower pin 23 of secondary winding;

Secondary winding 21 includes a copper bar of the upper coil of the secondary winding and a copper bar of the lower coil of the secondary winding, each shaped as an open circle; the copper bar of the upper coil of the secondary winding and the copper bar of the lower coil of the secondary winding are disposed in two different planes, and connected at one end to form a central tap 24 with the other ends extending forward, respectively;

First drain pin 25 and upper pin 22 of the secondary winding together are formed on a forward extension of the copper bar of the upper coil of the secondary winding, with first drain pin 25 disposed in front of upper pin 22 of the secondary winding;

Second drain pin 26 and lower pin 23 of the secondary winding together are formed on a forward extension of the copper bar of the lower coil of the secondary winding, with second drain pin 26 disposed in front of lower pin 23 of the secondary winding;

First drain pin 25 and second drain pin 26 are parallel to the plane on which the copper bar of the upper coil of the secondary winding and the copper bar of the lower coil of the secondary winding are formed;

Upper pin 22 of the secondary winding and lower pin 23 of the secondary winding are perpendicular to the plane on which the copper bar of the upper coil of the secondary Inductor winding copper bar 3, as shown in FIGS. 11-14, includes an inductor winding 31, a low-voltage connector 35 and a low-voltage output pin 32;

Inductor winding 11 includes a copper bar of the upper coil of the inductor winding and a copper bar of the lower coil of the inductor winding, each shaped as an open loop, the copper bar of the upper coil of the inductor winding and the copper bar of the lower coil of the inductor winding are disposed in two different planes, and connected at one end; the other end of the copper bar of the lower coil extends forward and the other end of the copper bar of the upper coil extends to the right, respectively;

A secondary winding connector 34 is formed on the right extension of the copper bar of the upper coil of the inductor;

Low-voltage output connector 35 and low-voltage output pin 32 are formed on the forward extension of the copper bar of the lower coil of the inductor;

Low-voltage output pin 32 is perpendicular to the plane on which the copper bar of the upper coil of the inductor and the copper bar of the lower coil of the inductor are formed;

Copper bar 4 for connecting a detection resistor, as shown in FIGS. 15-18, is of an elongated structure, with a ground pin 42 and two source pins 45 formed at the center, a pre-detection resistor connector 44 formed on the left, and ground pin 42 being perpendicular to source pins 45;

Copper bar 5 for connecting a drive circuit, as shown in FIGS. 19-22, includes a first gate pin 55 and a second gate pin 52, with first gate pin 55 bending downwards at both ends, second gate pin 52 disposed on the mid-left of first gate pin 55, and second gate pin 52 being perpendicular to first gate pin 55;

Copper bar 6 for connecting output ground terminal, as shown in FIGS. 23-26, with a ground pin 62 formed at the center, an output ground terminal connector 65 formed at the forward left, and a post-detection resistor connector 66 formed at the rear right;

Transformer secondary winding copper bar 2 is disposed above transformer primary winding copper bar 1, with the center of primary winding 11 corresponds to that of secondary winding 21;

Inductor winding copper bar 3 is disposed on the left side of transformer secondary winding copper bar 2 and transformer primary winding copper bar 1, with secondary winding connector 34 of inductor winding copper bar 3 electrically connected with central tap 24 of transformer secondary winding copper bar 2;

Copper bar 4 for connecting a detection resistor is disposed in front of the transformer secondary winding copper bar 2, with two source pins 45 arranged sequentially and alternately with two drain pins 25, 26 of the transformer secondary winding copper bar 2 and two gate pins 55 of copper bar 5 for connecting a drive circuit, thereby forming two groups of pins for connecting power components;

Copper bar 6 for connecting an output ground terminal is disposed in front of inductor winding copper bar 3 and on the left of copper bar 4 for connecting a detection resistor;

Upper pin 12 of primary winding, lower pin 13 of primary winding, upper pin 22 of secondary winding, lower pin 23 of secondary winding, ground pin 42, gate pin 52 all protrude from the upper surface of a plastic structure;

Drain pins 25, 26, source pin 45, gate pin 55, pre-detection resistor connector 44, post-detection resistor connector 66, low-voltage output connector 35 and output ground terminal connector 65 are all disposed outside the plastic structure.

Preferably, the bottom surface of the integrated copper bar for a secondary power circuit of a power electronic converter is disposed outside the plastic structure.

Preferably, primary winding 11 is shaped as a rectangle; the copper bar of the upper coil of the secondary winding and the copper bar of the lower coil of the secondary winding are each shaped as an unclosed rectangle; the copper bar of the upper coil of the inductor and the copper bar of the lower coil of the inductor are each shaped as an unclosed rectangle.

Preferably, pre-detection resistor connector 44, post-detection resistor connector 66, low-voltage output connector 35 and output ground terminal connector all have a round hole formed therein;

The detection resistor connects two detection resistor connectors;

The low-voltage output connector and the output ground terminal connector connect with corresponding copper bars through self-clinging nuts.

The integrated copper bar for the secondary power circuit of a power electronic converter in accordance with the present invention consolidates all copper bar structures through injection molding, and also integrates the winding copper bar structures of the transformer with those of the inductor. The integrated copper bar thus formed connects with the detection resistor and the output terminal by self-clinging nuts; the power circuit is connected with the control circuit and the high-voltage circuit through optionally soldering vertical pins onto the PCB; pins of power devices (such as MOSFETs) are laser soldered to the integrated copper bar to create an electric connection; bushing is provided through injection molding at proper positions to ensure that the nuts of the integrated copper bar are properly secured; the bottom surface of the power circuit copper bar is exposed, where the copper bar and the cooling plate are connected by an insulating and thermally conductive pad, and the cooling plate significantly reduces the temperature rise of the integrated copper bar by dissipating the heat directly, thereby the cross-sectional size and the volume of the integrated copper bar is reduced.

The integrated copper bar for the secondary power circuit of a power electronic converter in accordance with the present invention makes manufacturing and assembly easier; the integration of the winding copper bar structures of the transformer with those of the inductor simplifies the connection structures among the transformer, the inductor and the integrated copper bar; the transformer primary winding formed by punching pressing the copper bar, and the connection between the copper bar and the PCB through optionally soldering pins simplifies the connection between the transformer primary winding and the PCB; power devices (MOSFET) are connected with the integrated copper bar via laser soldering; the integrated structure of all copper bars, together with the magnetic core structure, constitutes the transformer and the inductor, and other magnetic components to perform corresponding functions. A proper magnetic core structure may be designed and assembled to function as a magnetic component with the winding structure, which eliminates the need to purchase power magnetic components and thus significantly reduces the costs.

The invention has been described by reference to the preferred embodiments. This does not intend to limit the scope of the present invention. Any modifications, replacements and improvements made to the invention without departing from the spirit and principles of the present invention shall be considered to fall within the scope of the present invention.

What is claimed is:

1. An integrated copper bar for a secondary power circuit of a power electronic converter, comprising a transformer primary winding copper bar, a transformer secondary winding copper bar, an inductor winding copper bar, a copper bar for connecting a detection resistor, a copper bar for connecting a drive circuit and a copper bar for connecting an output terminal;

said transformer primary winding copper bar, said transformer secondary winding copper bar, said inductor winding copper bar, said copper bar for connecting a detection resistor, said copper bar for connecting a drive circuit and said copper bar for connecting an output ground terminal are fixed together via injection molding; wherein, said transformer secondary winding copper bar comprises a secondary winding, a first drain pin, a second drain pin, an upper pin of said secondary winding and a lower pin of said secondary winding;

said secondary winding comprises a copper bar of the upper coil of said secondary winding and a copper bar of the lower coil of said secondary winding, with said copper bar of the upper coil and said copper bar of the lower coil each shaped as an open loop, the copper bar of the upper coil of the secondary winding and the copper bar of the lower coil of the secondary winding are disposed in two different planes, and connected at one end to form a central tap, with the other ends extending forward, respectively;

said first drain pin and said upper pin of said secondary winding are together formed on a forward extension of said copper bar of the upper coil of said secondary winding, with said first drain pin disposed in front of said upper pin of said secondary winding;

said second drain pin and said lower pin of said secondary winding are together formed on a forward extension of said copper bar of the lower coil of said secondary winding, with said second drain pin disposed in front of said lower pin of said secondary winding;

said first drain pin and said second drain pin are parallel to the plane on which said copper bar of the upper coil of said secondary winding and said copper bar of the lower coil of said secondary winding are formed;

said upper pin of said secondary winding and said lower pin of said secondary winding are perpendicular to the plane on which said copper bar of the upper coil of said secondary winding and said copper bar of the lower coil of said secondary winding are formed.

2. The integrated copper bar for a secondary-side power circuit of a power electronic converter of claim 1, wherein, said transformer primary winding copper bar comprises a primary winding, an upper pin of said primary winding and a lower pin of said primary winding;

said primary winding is formed by more than 5 turns of wire lying in the same plane;

said upper pin of said primary winding and said lower pin of said primary winding are formed at two ends of said primary winding and are perpendicular to the plane of said primary winding;

said inductor winding copper bar comprises an inductor winding, a low-voltage output connector and a low-voltage output pin;

said inductor winding comprises a copper bar of the upper coil of said inductor winding and a copper bar of the lower coil of said inductor winding, the copper bar of the upper coil and said copper bar of the lower coil are each shaped as an open loop, disposed in two different planes, and connected at one end, with the other end of said copper bar of the lower coil extending forward and that of said copper bar of the upper coil extending to the right, respectively;

a secondary winding connector is formed on said right extension of said copper bar of the upper coil of the inductor;

said low-voltage output connector and said low-voltage output pin are formed on said forward extension of said copper bar of the lower coil of the inductor;

said low-voltage output pin is perpendicular to the plane on which said copper bar of the upper coil of the inductor and copper bar of the lower coil of the inductor are formed;

said copper bar for connecting a detection resistor is an elongated structure, with a ground pin and two source pins formed at the center, a pre-detection resistor connector formed on the left, and said ground pin being perpendicular to said source pins;

said copper bar for connecting a drive circuit comprises a first gate pin and a second gate pin, with said first gate pin bending downwards at both ends, said second gate pin disposed on the mid-left of said first gate pin, and said second gate pin being perpendicular to said first gate pin;

said copper bar for connecting the output ground terminal has a ground pin formed at the center, an output ground terminal connector formed on the forward left, and a post-detection resistor connector formed on the rear right;

said transformer secondary winding copper bar is disposed above said transformer primary winding copper bar, with the center of said primary winding corresponds to that of said secondary winding;

said inductor winding copper bar is disposed on the left side of said transformer secondary winding copper bar and said transformer primary winding copper bar, with the secondary winding connector of said inductor winding copper bar connected with the central tap of said transformer secondary winding copper bar;

said copper bar for connecting a detection resistor is disposed in front of said transformer secondary winding copper bar, with two source pins arranged sequentially and alternately with two drain pins of said transformer secondary winding copper bar and two gate pins of said copper bar for connecting a drive circuit, thereby forming two groups of pins for connecting power devices;

said copper bar for connecting an output ground terminal is located in front of said inductor winding copper bar and on the left side of said copper bar for connecting a detection resistor;

said upper pin of primary winding, said lower pin of primary winding, said upper pin of secondary winding, said lower pin of secondary winding, said low-voltage output pin, said ground pin and said gate pins all protrude from the upper surface of a plastic structure; and said drain pins, said source pins, said gate pins, said pre-detection resistor connector, said post-detection resistor connector, said low-voltage output connector and said output ground connector are all disposed outside the plastic structure.

3. The integrated copper bar for a secondary-side power circuit of a power electronic converter of claim 2, wherein, the bottom surface of said integrated copper bar for a secondary-side power circuit of a power electronic converter is disposed outside of the plastic structure.

4. The integrated copper bar for a secondary-side power circuit of a power electronic converter of claim 3, wherein, said primary winding is shaped as a rectangle ring;

said copper bar of the upper coil of said secondary winding and said copper bar of the lower coil of said secondary winding are each shaped as an unclosed rectangle ring; and said copper bar of the upper coil of the inductor and said copper bar of the lower coil of the inductor are each shaped as an unclosed rectangle ring.

5. The integrated copper bar for a secondary-side power circuit of a power electronic converter of claim 3, wherein, said two detection resistor connectors, said low-voltage output connector and said output ground connector all have a round hole formed therein;

detection resistor connects two detection resistor connectors; and said low-voltage output connector and said output ground connector connect with corresponding copper bars through self-clinging nuts.

* * * * *